(12) United States Patent
Yokoyama et al.

(10) Patent No.: US 7,867,801 B2
(45) Date of Patent: Jan. 11, 2011

(54) APPARATUS FOR PRODUCING GROUP-III NITRIDE SEMICONDUCTOR LAYER, METHOD OF PRODUCING GROUP-III NITRIDE SEMICONDUCTOR LAYER, METHOD OF PRODUCING GROUP-III NITRIDE SEMICONDUCTOR LIGHT-EMITTING DEVICE, GROUP-III NITRIDE SEMICONDUCTOR LIGHT-EMITTING DEVICE THEREOF, AND LAMP THEREOF

(75) Inventors: Yasunori Yokoyama, Ichihara (JP);
Takehiko Okabe, Ichihara (JP);
Hisayuki Miki, Chiba (JP)

(73) Assignee: Showa Denko K.K., Tokyo (JP)

( * ) Notice: Subject to any disclaimer, the term of this patent is extended or adjusted under 35 U.S.C. 154(b) by 400 days.

(21) Appl. No.: 12/133,010

(22) Filed: Jun. 4, 2008

(65) Prior Publication Data

US 2008/0303054 A1 Dec. 11, 2008

(30) Foreign Application Priority Data

Jun. 7, 2007 (JP) .......................... P2007-151670

(51) Int. Cl.
*H01L 21/00* (2006.01)

(52) U.S. Cl. .................... 438/46; 438/485; 438/767

(58) Field of Classification Search .................... 438/46, 438/485, 767
See application file for complete search history.

(56) References Cited

U.S. PATENT DOCUMENTS 7,738,524 B2 * 6/2010 Ochiai et al. .............. 372/49.01

OTHER PUBLICATIONS

Yukiko, Ushiku, et al.; "21st seiki rengo symposium ronbunshyu"; vol. 2; 2003; pp. 295-298.

* cited by examiner

*Primary Examiner*—Douglas M Menz
(74) *Attorney, Agent, or Firm*—Sughrue Mion, PLLC (57) ABSTRACT

An apparatus for producing a group-III nitride semiconductor layer which forms a group-III nitride semiconductor layer on a substrate by a sputtering method, the apparatus including: a first plasma-generating region where a target containing a group-III element is disposed and the target is sputtered to generate material particles formed of a material contained in the target; and a second plasma generating region where the substrate is disposed and nitrogen-containing plasma is generated. The first plasma-generating region and the second plasma-generating region are provided inside a chamber, and the first plasma-generating region and the second plasma-generating region are separated by a shielding wall which has an opening part from which the material particles are supplied onto the substrate. Also disclosed are a method of producing a group-III nitride semiconductor layer, a method of producing a group-III nitride semiconductor light-emitting device, and a lamp thereof.

11 Claims, 5 Drawing Sheets

APPARATUS FOR PRODUCING GROUP-III NITRIDE SEMICONDUCTOR LAYER, METHOD OF PRODUCING GROUP-III NITRIDE SEMICONDUCTOR LAYER, METHOD OF PRODUCING GROUP-III NITRIDE SEMICONDUCTOR LIGHT-EMITTING DEVICE, GROUP-III NITRIDE SEMICONDUCTOR LIGHT-EMITTING DEVICE THEREOF, AND LAMP THEREOF

FIELD OF THE INVENTION

The present invention relates to an apparatus for producing a group-III nitride semiconductor layer, a method of producing a group-III nitride semiconductor layer, a method of producing a group-III nitride semiconductor light-emitting device, group-III nitride semiconductor light-emitting device thereof, and a lamp thereof. In particular, the present invention relates to an apparatus for producing a group-III nitride semiconductor layer, and a method of producing a group-III nitride semiconductor layer, which can form a group-III nitride semiconductor layer having excellent crystal properties.

BACKGROUND OF THE INVENTION

Until now, production apparatuses and production methods wherein a group-III nitride semiconductor layer that includes nitride compound semiconductor crystals, etc. is formed by a sputtering method such as a reactive sputtering method have been studied. In such a conventional reactive sputtering method, a target containing group-III elements such as Ga or Al, which is disposed inside the sputtering apparatus, is sputtered while plasma of a reactive gas including nitrogen elements (such as a nitrogen gas) is generated whereby the group-III elements are reacted with the reactive gas to form a group-III nitride semiconductor layer.

For example, a method wherein a GaN layer is formed on the (100) plane of Si and the (0001) plane of sapphire ($Al_2O_3$) by a radio frequency magnetron sputtering method using $N_2$ gas is mentioned (for example, see Yukiko Ushiku et al.: "$21^{st}$ seiki rengo symposium ronbunshyu", vol. 2, p 295, 2003).

SUMMARY OF THE INVENTION

However, in such a conventional reactive sputtering method, a portion of plasma of the reactive gas reacts with the surface of the target, and a film of nitrides is frequently formed on the surface of the target. If such a film of nitrides is formed on the surface of the target, the sputtering rate will vary. Accordingly, it is difficult to control the thickness of the formed group-III nitride semiconductor layer. Furthermore, because phenomena where the film of nitrides present on the surface of the target is sputtered often occur, crystals of a group-III nitride semiconductor layer having excellent crystal properties may not be formed on the substrate, and this is a problem. Such a problem has been evident particularly in continuously forming a group-III nitride semiconductor layer for a long time.

The present invention was achieved to solve the above problems. The object of the present invention is to provide an apparatus for producing a group-III nitride semiconductor layer which can prevent such a film of nitrides from being formed on the surface of the target and which can precisely control the thickness of the film, thereby producing a group-III nitride semiconductor layer having excellent crystal properties.

Another object of the present invention is to provide a method of producing a group-III nitride semiconductor layer which can prevent such a film of nitrides from being formed on the surface of the target and which can precisely control the thickness of the film, thereby producing a group-III nitride semiconductor layer having excellent crystal properties.

Yet another object of the present invention is to provide a method of producing a group-III nitride semiconductor light-emitting device which includes the steps of producing a group-III nitride semiconductor layer of the present invention; a group-III nitride semiconductor light-emitting device produced by the method of producing a group-III nitride semiconductor light-emitting device; and a lamp including the group-III nitride semiconductor light-emitting device of the present invention.

Specifically, the present invention relates to the following aspects.

[1] An apparatus for producing a group-III nitride semiconductor layer which forms a group-III nitride semiconductor layer on a substrate by a sputtering method, the apparatus including: a first plasma-generating region where a target containing a group-III element is disposed and the target is sputtered to generate material particles formed of a material contained in the target; and a second plasma-generating region where the substrate is disposed and nitrogen-containing plasma is generated, wherein the first plasma-generating region and the second plasma-generating region are provided inside a chamber, and the first plasma-generating region and the second plasma-generating region are separated by a shielding wall which has an opening part from which the material particles are supplied onto the substrate.

[2] The apparatus for producing a group-III nitride semiconductor layer according to [1], wherein the target and the substrate are disposed facing one another through the opening part.

[3] The apparatus for producing a group-III nitride semiconductor layer according to [1] or [2], wherein the target contains at least one selected from the group consisting of Al, Ga and In.

[4] A method of producing a group-III nitride semiconductor layer which forms a group-III nitride semiconductor layer on a substrate by a sputtering method using the apparatus for producing a group-III nitride semiconductor layer according to any one of [1] to [3], the method including: a first plasma-generating step where material particles are produced in the first plasma-generating region; and a second plasma-generating step where the nitrogen-containing plasma is supplied onto the substrate in the second plasma-generating region, wherein the first plasma-generating step and the second plasma-generating step are performed at the same time, and the material particles are supplied onto the substrate through the opening part.

[5] The method of producing a group-III nitride semiconductor layer according to [4], wherein the material particles are supplied from the target, which is disposed facing the substrate through the opening part, onto the substrate.

[6] The method of producing a group-III nitride semiconductor layer according to [4] or [5], wherein the target contains at least one selected from the group consisting of Al, Ga and In.

[7] A method of producing a group-III nitride semiconductor light-emitting device wherein the group-III nitride semiconductor light-emitting device includes a semiconductor layer in which an n-type semiconductor layer, a light-emitting layer and a p-type semiconductor layer that are formed of a group-III nitride semiconductor are laminated over a substrate, the method including: forming at least one portion of the semiconductor layer by the method of producing a group-III nitride semiconductor layer according to any one of [4] to [6].

[8] A method of producing a group-III nitride semiconductor light-emitting device wherein the group-III nitride semiconductor light-emitting device includes a semiconductor layer in which an n-type semiconductor layer, a light-emitting layer and a p-type semiconductor layer that are formed of a group-III nitride semiconductor are laminated over a substrate; and a buffer layer formed of a group-III nitride semiconductor between the substrate and the n-type semiconductor layer, the method including: forming the buffer layer by the method of producing a group-III nitride semiconductor layer according to any one of [4] to [6].

[9] A group-III nitride semiconductor light-emitting device which is obtained by the method of producing a group-III nitride semiconductor light-emitting device according to [7] or [8].

[10] A lamp including the group-III nitride semiconductor light-emitting device according to [9].

The apparatus for producing a group-III nitride semiconductor layer according to the present invention includes: a first plasma-generating region where a target containing a group-III element is disposed and the target is sputtered to generate material particles formed of a material contained in the target; a second plasma-generating region where the substrate is disposed and nitrogen-containing plasma is generated, wherein the first plasma-generating region and the second plasma-generating region are provided inside a chamber, and the first plasma-generating region and the second plasma-generating region are separated by a shielding wall which has an opening part from which the material particles are supplied onto the substrate. Therefore, it is difficult for the surface of the target to come into contact with nitrogen elements whereby the formation of the nitride film on the surface of the target can be prevented. Consequently, according to the apparatus for producing a group-III nitride semiconductor layer of the present invention, the film thickness can be precisely controlled, and a group-III nitride semiconductor layer having excellent crystal properties can be formed.

Moreover, the method of producing a group-III nitride semiconductor layer according to the present invention uses the apparatus for producing a group-III nitride semiconductor layer according to the present invention, and the method includes: a first plasma-generating step where material particles are produced in the first plasma-generating region; and a second plasma-generating step where the nitrogen-containing plasma is supplied onto the substrate in the second plasma-generating region, wherein the first plasma-generating step and the second plasma-generating step are performed at the same time, and the material particles are supplied onto the substrate through the opening part. Therefore, it is difficult for the surface of the target to come into contact with nitrogen elements whereby the formation of the nitride film on the surface of the target can be prevented. Consequently, according to the method for producing a group-III nitride semiconductor layer of the present invention, the film thickness can be precisely controlled, and a group-III nitride semiconductor layer having excellent crystal properties can be formed.

Furthermore, the method of producing a group-III nitride semiconductor light-emitting device according to the present invention adopts the method of producing a group-III nitride semiconductor layer of the present invention. Therefore, a group-III nitride semiconductor light-emitting device including a group-III nitride semiconductor layer having excellent crystal properties where the film thickness can be precisely controlled can be obtained.

Additionally, the group-III nitride semiconductor light-emitting device and the lamp of the present invention are obtained by the method of producing a group-III nitride semiconductor light-emitting device of the present invention. Therefore, the group-III nitride semiconductor light-emitting device and the lamp can have a group-III nitride semiconductor layer whose thickness is precisely controlled and which has excellent crystal properties, thereby exhibiting excellent light-emitting properties.

The numerical symbol "1" refers to a group-III nitride semiconductor light-emitting device (light-emitting device); the numerical symbol "3" refers to a lamp; the numerical symbol "10" refers to a laminate semiconductor; the numerical symbol "11" refers to a substrate; the numerical symbol "12" refers to a buffer layer; the numerical symbol "14" refers to an n-type semiconductor layer; the numerical symbol "15" refers to a light-emitting layer; the numerical symbol "16" refers to a p-type semiconductor; the numerical symbol "17" refers to a translucent positive electrode; the numerical symbol "40" refers to a sputtering machine; and the numerical symbol "41" refers to a chamber; the numerical symbol "43" refers to an opening part; the numerical symbol "44" refers to a heater; the numerical symbol "45" refers to a shielding wall; the numerical symbol "45a" refers to a first plasma-generating region; the numerical symbol "45b" refers to a second plasma-generating region; the numerical symbols "46a" and "46b" refer to a matching box; the numerical symbol "47" refers to a target; the numerical symbols "48a" and "48b" refer to a power supply; the numerical symbol "51" refers to a first plasma-generating device; and the numerical symbol "52" refers to a second plasma-generating device.

BEST MODE FOR CARRYING OUT THE INVENTION

Hereinafter, with regard to the apparatus for producing a group-III nitride semiconductor layer, the method of producing a group-III nitride semiconductor layer, the method of producing a group-III nitride semiconductor light-emitting device, the light-emitting device and the lamp, the embodiments thereof are described in details with reference to the figures.

[Sputtering Machine (Apparatus for Producing a Group-III Nitride Semiconductor Layer)]

Figure 1:
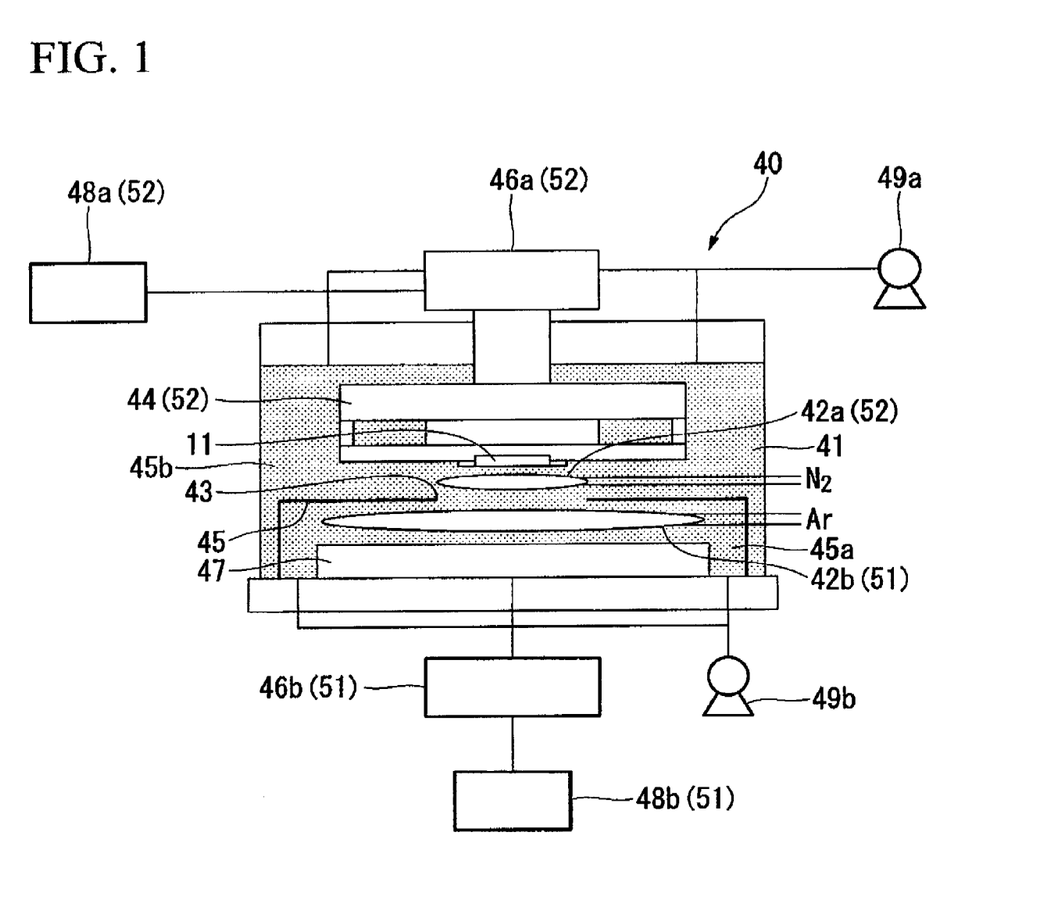
FIG. 1 is a schematic diagram of a sputtering machine which is an example of the apparatus for producing a group-III nitride semiconductor layer of the present invention.

FIG. 1 is a schematic diagram of a sputtering machine which is an example of the apparatus for producing a group-III nitride semiconductor layer of the present invention. A sputtering machine 40 shown in FIG. 1 is used for producing a group-III nitride semiconductor layer formed of AlGaN, InGaN, AlInN, InN, AlInGaN, AlN, GaN or the like. In the sputtering machine 40, as shown in FIG. 1, a first plasma-generating region 45a and a second plasma-generating region 45b are provided inside a chamber 41.

A target 47 containing a group-III element is disposed in the first plasma-generating region 45a. First plasma containing argon is generated in the first plasma-generating region 45a to sputter the target 47 whereby material particles made of materials contained in the target 47 are produced. In addition, a substrate 11 is disposed in the second plasma-generating region 45b. Second plasma containing nitrogen (nitrogen-containing plasma) is generated in the second plasma-generating region 45b, and supplied onto the substrate 11.

As shown in FIG. 1, the first plasma-generating region 45a and the second plasma-generating region 45b are separated by a shielding wall 45. An opening part 43 is provided in the shielding wall 45, and the target 47 disposed in the first plasma-generating region 45a faces the substrate 11 disposed in the second plasma-generating region 45b through the opening part 43. Accordingly, in the sputtering machine 40 shown in FIG. 1, material particles produced in the first plasma-generating region 45a are supplied onto the substrate 11 disposed in the second plasma-generating region 45b through the opening part 43.

In the sputtering machine 40 shown in FIG. 1, a first plasma-generating device 51 which generates first plasma containing argon; a second plasma-generating device 52 which generates second plasma containing nitrogen; and a control device (not shown in figures) which controls the first plasma-generating device 51 and the second plasma-generating device 52 are provided.

The first plasma-generating device 51 includes a matching box 46b which applies a predetermined power to the target 47; a power supply 48b which is conductively connected to the matching box 46b; and an argon gas-supplying device 42b which supplies argon gas into the first plasma-generating region 45a. It is preferable that the argon gas-supplying device 42b have a ring-like inlet that can supply argon gas uniformly to the target 47, as shown in FIG. 1. However, the argon gas-supplying device 42b may not have such a ring-like inlet. The power applied to the target 47 (applying power) can be adjusted by the control of the matching box 46b. Furthermore, the matching box 46b and the argon, gas supplying device 42b are controlled by a control device (not shown in figures).

The second plasma-generating device 52 includes a heater 44 which heats the substrate 11; a matching box 46a which is conductively connected to the substrate 11; a power supply 48a which is conductively connected to the matching box 46a; and a nitrogen gas-supplying device 42a which supplies nitrogen gas into the second plasma-generating region 45b. It is preferable that the nitrogen gas-supplying device 42a have a ring-like inlet that can supply nitrogen gas uniformly to the substrate 11, as shown in FIG. 1. However, the nitrogen gas-supplying device 42a may not have such a ring-like inlet. The power (applying power) applied toward the substrate 11 can be adjusted by the control of the matching box 46a. Furthermore, the matching box 46a and the nitrogen gas-supplying device 42a are controlled by a control device (not shown in figures).

The target 47 contains a group-III element such as Ga or Al that corresponds to elements included in the formed group-III nitride semiconductor layer. The target 47 may contain a dopant element such as Si or Mg if required, or a dopant target made of such a dopant element may be disposed on the target 47.

In the first plasma-generating region 45a of the sputtering machine 40 shown in FIG. 1, a pressure-controlling device 49b which includes, among others, a pump to maintain the pressure inside the first plasma-generating region 45a at a predetermined pressure is provided. In the second plasma-generating region 45b, a pressure-controlling device 49a which includes, among others, a pump to maintain the pressure inside the second plasma-generating region 45b at a predetermined pressure is provided.

In the present embodiment, the power (applying power) supplied from the power supply 49a or 48b is applied in a pulse DC system or an RF (radio frequency) system. It is preferable that the applying power be applied in an RF (radio frequency) system because the film-forming rate can be easily controlled. However, distribution of plasma will be broadened in such RF electric discharge, and devices inside the chamber are corroded, and their component elements may be unfavorably incorporated into the formed film as impurities. If it is required to suppress the contamination of such impurities to a lower level, then, the DC electric discharge will be preferred. Additionally, when the target 47 is continuously exposed to an electric field in a DC system, the target 47 is charged (charge build-up). Consequently, it is difficult to increase the film-forming rate. Therefore, when the applying power is supplied in a DC system, a pulsed DC system is preferable where a bias is applied in a pulsed manner.

[Method of Producing a Group-III Nitride Semiconductor Layer]

When a group-III nitride semiconductor layer is formed on the substrate 11 using the sputtering machine 40 shown in FIG. 1, a first plasma-generating step where material particles, which are made of materials contained in the target 47, are produced in the first plasma-generating region 45a; and a second plasma-generating step where the second plasma containing nitrogen is supplied onto the substrate 11 in the second plasma-generating region 45b are performed at the same time, and the material particles produced in the first plasma-generating region 45a are supplied onto the substrate 11 disposed in the second plasma-generating region 45b through the opening part 43 provided in the shielding wall 45.

[First Plasma-Generating Step]

Argon gas is supplied with the argon gas-supplying device 42b, and the inside of the first plasma-generating region 45a is preferably controlled to an atmosphere of argon at 0.1 to 10 Pa by using the pressure-controlling device 49b. If the pressure inside the first plasma-generating region 45a is less than 0.1 Pa, stable plasma discharge may not be achieved. On the other hand, if the pressure inside the first plasma-generating region 45a exceeds 10 Pa, plasma may spread over the substrate 11.

Furthermore, it is preferable that power of 0.2 W/cm$^2$ to 20 W/cm$^2$ be applied to the target 47 through the matching box 46b from the power supply 48b, and the power is more preferably within a range of 1 W/cm$^2$ to 10 W/cm$^2$. If the power applied to the target 47 is less than 0.2 W/cm$^2$, stable plasma discharge may not be achieved or the film-forming rate will be slower. Therefore, such a range is not preferable. On the other hand, if the power applied to the target 47 exceeds 20 W/cm$^2$, energy of sputtered particles will be increased, thereby damaging the film-formed crystals.

Thus, while the inside of the first plasma-generating region 45a is adjusted to an argon atmosphere of a predetermined pressure, predetermined power is applied to the target 47. Consequently, the first plasma containing argon is generated, and material particles made of materials that form the target 47 (i.e. such as group-III elements) are released from the target 47 to a gas phase inside the first plasma-generating region 45a.

[Second Plasma-Generating Step]

Nitrogen gas is supplied with the nitrogen gas-supplying device 42a, and the inside of the second plasma-generating region 45b is preferably controlled to a nitrogen atmosphere at 0.1 to 10 Pa by using the pressure-controlling device 49a. If the pressure inside the second plasma-generating region 45b is less than 0.1 Pa, stable plasma discharge may not be achieved. On the other hand, if the pressure inside the second plasma-generating region 45b exceeds 10 Pa, plasma may spread over the substrate 11.

In addition, in the present embodiment, nitrogen gas is used as an active gas. However, generally-known nitride materials can be used without any limitations instead of nitrogen gas. It is preferable that ammonia or nitrogen be used because these are easily handled, cheap and easily available. Ammonia has sufficient decomposition-efficiency whereby a film can be formed at a higher growth rate. Therefore, ammonia is preferable from this view point. However, because ammonia has higher reactivity, it is required to use chemically-stable materials for equipment used in a reactor, and such a reactor is costly. Therefore, in terms of costs for a reactor, nitrogen ($N_2$) is more preferably used than ammonia.

Furthermore, it is preferable that a power of 0.1 $W/cm^2$ to 10 $W/cm^2$ be applied toward the substrate 11 through the matching box 46a from the power supply 48a, and the power is more preferably within a range of 0.5 $W/cm^2$ to 5 $W/cm^2$. If the power applied toward the substrate 11 is less than 0.1 $W/cm^2$, stable electric discharge may not be achieved, or the nitrogen gas may not be sufficiently decomposed and the nitrogen gas cannot be sufficiently activated. On the other hand, the power applied toward the substrate 11 exceeds 10 $W//cm^2$, energy of sputtered particles will be increased, thereby damaging the film-formed crystals.

The temperature of the substrate 11 is preferably within a range of 300° C. to 1500° C., and more preferably within arrange of 500° C. to 1200° C. If the temperature of the substrate 11 is less than the above-mentioned lower limit, the reaction between material particles produced inside the first plasma-generating region 45a and the second plasma containing nitrogen may insufficiently proceed.

On the other hand, if the temperature of the substrate 11 exceeds the above-mentioned upper limit, decomposition speed of group-III nitrides formed into a film on the substrate 11 will be accelerated whereby it is difficult for crystals of group-III nitrides to sufficiently grow thereon. Therefore, such a range is not preferable.

Thus, while the inside of the second plasma-generating region 45b is adjusted to a nitrogen atmosphere of a predetermined pressure, predetermined power is applied toward the substrate 11. Consequently, the second plasma containing nitrogen is generated, and supplied onto the substrate 11.

In the present embodiment, material particles produced inside the first plasma-generating region 45a are supplied onto the substrate 11 disposed in the second plasma-generating region 45b through the opening part 43 such that the material particles collide against the surface of the substrate 11. Then, the material particles are nitrided by the second plasma generated inside the second plasma-generating region 45b whereby a group-III nitride semiconductor layer is formed on the substrate 11.

When the group-III nitride semiconductor layer is formed in the present embodiment, its film-forming rate is preferably within a range of 0.01 nm/s to 10 nm/s. If the film-forming rate is less than 0.01 nm/s, it will take a long time to complete the film-forming process. Therefore, such a range will be wasteful in industrial production. On the other hand, if the film-forming rate exceeds 10 nm/s, a group-III nitride semiconductor layer having excellent crystal properties may not be obtained.

The sputtering machine 40 according to the present embodiment includes: a first plasma-generating region 45a where the first plasma to sputter the target 47 is generated to produce material particles; and the second plasma-generating region 45b where the second plasma containing nitrogen is generated, thereby supplying the second plasma onto the substrate 11, wherein the first plasma-generating region 45a and the second plasma-generating region 45b are provided inside a chamber 41, and the first plasma-generating region 45a where the target 47 is disposed and the second plasma-generating region 45b where the substrate 11 is disposed are separated by a shielding wall 45 which has an opening part 43 from which the material particles are supplied onto the substrate 11. Therefore, it is difficult for the surface of the target to come into contact with nitrogen whereby formation of a nitride film on the surface of the target 47 can be prevented. Consequently, according to the sputtering machine 40 of the present embodiment, the film thickness can be precisely controlled, and a group-III nitride semiconductor layer having excellent crystal properties can be formed.

In the sputtering machine 40 according to the present embodiment, the target 47 and the substrate 11 are disposed such that they face one another through the opening part 43. Accordingly, the material particles can be supplied uniformly onto the substrate 11 whereby a group-III nitride semiconductor layer having further excellent crystal properties can be produced.

Moreover, the sputtering machine 40 according to the present embodiment includes the argon-gas-supplying device 42b having a ring-like inlet. Accordingly, the argon gas can be supplied uniformly to the target 47, and material particles can also be supplied uniformly onto the substrate 11 whereby a group-III nitride semiconductor layer having further excellent crystal properties can be produced.

Furthermore, the sputtering machine 40 according to the present embodiment includes the nitrogen-gas-supplying device 42a having a ring-like inlet. Accordingly, the nitrogen gas can be supplied uniformly to the substrate 11 whereby a group-III nitride semiconductor layer having further excellent crystal properties can be produced.

The method of producing a group-III nitride semiconductor layer according to the present embodiment includes: a first plasma-generating step where material particles are produced in the first plasma-generating region 45a; and a second plasma-generating step where the second plasma is supplied onto the substrate 11 in the second plasma-generating region 45b that is separated from the first plasma-generating region 45a by the shielding wall 45, wherein the first plasma-generating step and the second plasma-generating step are performed at the same time, and the material particles, which are generated in the first plasma-generating region 45a, are supplied onto the substrate 11, which is disposed in the second plasma-generating region 45b, through the opening part 53 provided in the shielding wall 45. Therefore, it is difficult for the surface of the target 47 to come into contact with nitrogen whereby formation of a nitride film on the surface of the target 47 can be prevented.

Furthermore, in the method of producing a group-III nitride semiconductor layer according to the present embodiment, material particles, which are formed of materials contained in the target 47, are supplied onto the substrate 11 from the target 47 which is disposed facing the substrate 11 through the opening part 43. Accordingly, the material particles can be easily supplied uniformly onto the substrate 11 whereby a group-III nitride semiconductor layer having further excellent crystal properties can be produced.

Hereinafter, the group-III nitride semiconductor light-emitting device of the present invention (simply referred to as a "light-emitting device" in some parts of the description below) and the production method thereof are described.

[Group-III Nitride Semiconductor Light-Emitting Device]

Figure 2:
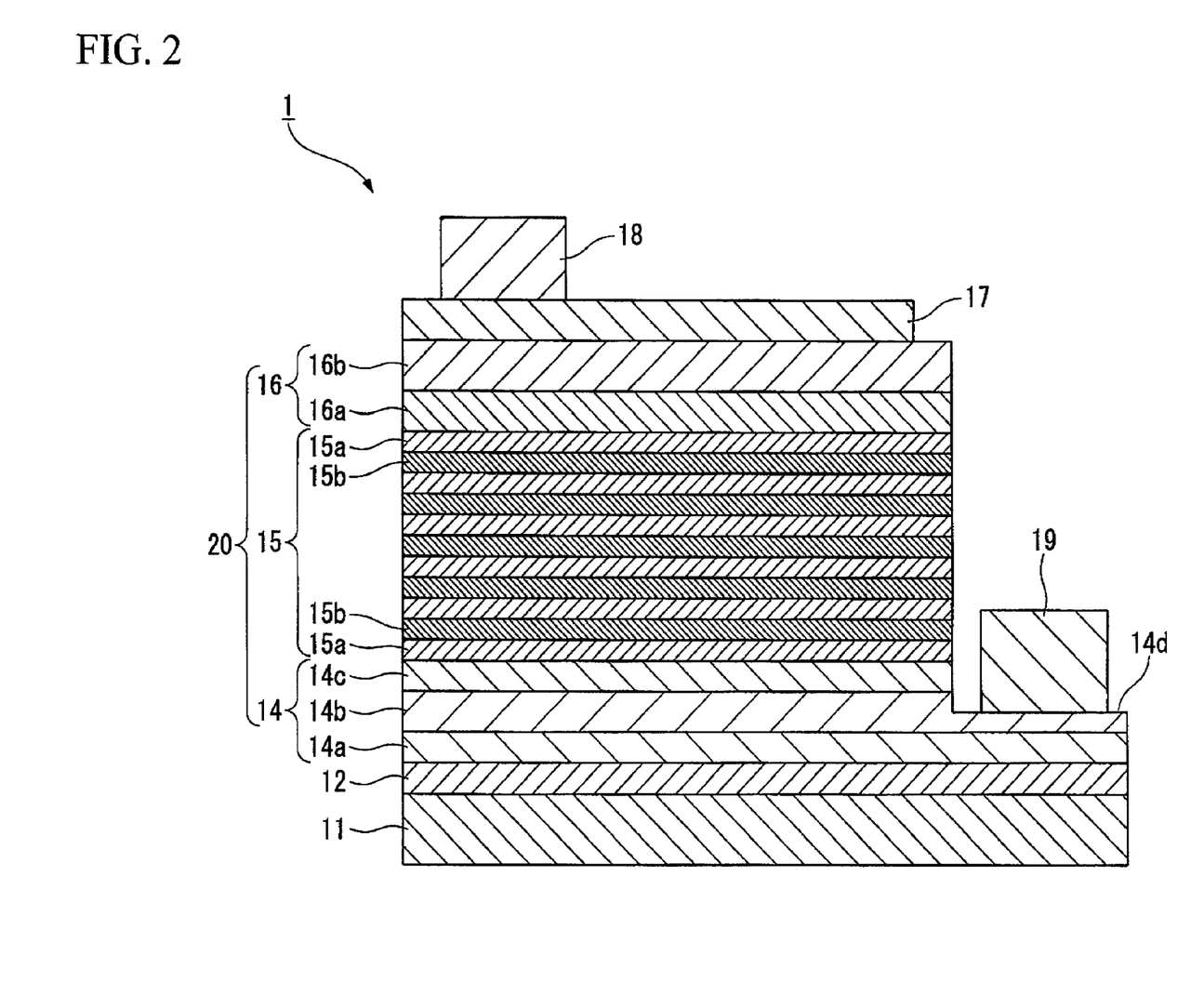
FIG. 2 is a cross-sectional view showing an example of the group-III nitride semiconductor light-emitting device of the present invention.
Figure 3:
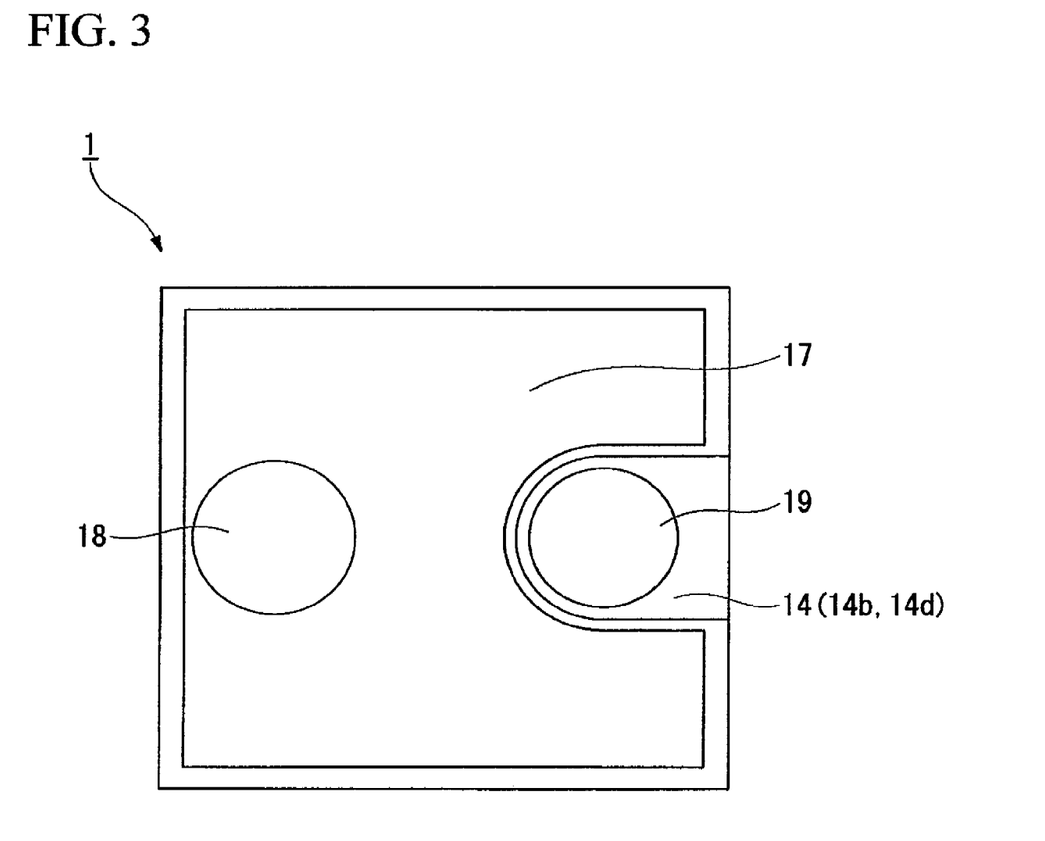
FIG. 3 is a schematic diagram showing the planar structure of the group-III nitride semiconductor light-emitting device shown in FIG. 2.

FIG. 2 is a cross-sectional view showing an example of the group-III nitride semiconductor light-emitting device of the present invention. FIG. 3 is a schematic diagram showing the planar structure of the group-III nitride semiconductor light-emitting device shown FIG. 2.

The light-emitting device 1 of the present embodiment is a face-up type, as shown in FIG. 2, and a buffer layer 12, and a semiconductor layer 20 including a group-III nitride semiconductor containing Ga as a group-III element are formed on the substrate 11. In the semiconductor layer 20, as shown in FIG. 2, an n-type semiconductor layer 14, a light-emitting layer 15, and a p-type semiconductor layer 16 are laminated in that order.

[Laminate Structure of the Light-Emitting Device]

<Substrate>

A material used for the substrate 11 in the light-emitting device 1 of the present embodiment is not particularly limited as long as group-III nitride semiconductor crystals can be epitaxially grown on the surface of the substrate 11, and appropriate materials can be selected. For example, sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, etc. can be mentioned.

<Buffer Layer>

In the light-emitting device 1 of the present embodiment, a buffer layer 12 made of a group-III nitride semiconductor is formed on the substrate by a film-forming method using plasma such as a sputtering method.

The buffer layer 12 may be made of an aggregate form of columnar crystals, or may be a single-crystal AlN film. In either crystal structure, the buffer layer 12 is often formed on the substrate 11 by a sputtering method.

With regard to a material for forming the buffer layer 12, any group-III nitride semiconductors represented by general formula of AlGaInN can be used. Moreover, a composition including As or P as group-V may be adopted. The composition of the buffer layer 12 preferably includes Al, and it is preferable that the composition be GaAlN. In this case, it is preferable that the composition include 50% or more of Al, and the composition is more preferably AlN.

The thickness of the buffer layer 12 is preferably within a range of 10 to 500 nm, and more preferably within a range of 20 to 100 nm.

If the thickness of the buffer layer 12 is less than 10 nm, the above-described buffer function will be insufficient. On the other hand, if the thickness of the buffer layer 12 exceeds 500 nm, its film-forming process will require a long time, thereby lowering its productivity although its function as a coat layer will not vary. In addition, the thickness of the buffer layer 12 can be easily measured based on the cross-sectional TEM photograph thereof.

<Semiconductor Layer>

As shown in FIG. 2, the semiconductor layer 20 includes an n-type semiconductor layer 14; a light-emitting layer 15; and a p-type semiconductor layer 16.

{n-Type Semiconductor Layer}

The n-type semiconductor layer 14 is laminated on the buffer layer 12, and includes an underlying layer 14a, an n-type contact layer 14b and an n-type clad layer 14c. In addition, the n-type contact layer can function as the underlying layer and/or the n-type clad layer. However, the underlying layer can function as the n-type contact layer and/or the n-type clad layer.

(Underlying Layer)

The underlying layer 14a of the n-type semiconductor layer 14 of the present embodiment is made of a group-III nitride semiconductor. The material for the underlying layer 14a may be the same as the buffer layer 12 or different from the buffer layer 12. It is preferable that the material for the underlying layer 14a be a group-III nitride semiconductor containing Ga, i.e. a GaN-based compound semiconductor. Furthermore, the underlaying layer 14a is preferably an $Al_xGa_{1-x}N$ layer ($0 \leq x \leq 1$, preferably $0 \leq x \leq 0.5$, and more preferably $0 \leq x \leq 0.1$).

For example, when the buffer layer 12 is formed into AlN, it is preferable that the transition of the underlying layer 14a be looped by migration lest the underlying layer 14a receive the same crystal properties from the buffer layer 12, which is an aggregate of column crystals. Such looping of the transition is likely to occur in GaN-based compound semiconductors. In particular, AlGaN or GaN is preferable.

The thickness of the underlying layer 14a is preferably 0.1 μm or more, more preferably 0.5 μm or more, and most preferably 1 μm or more. If the thickness is within such a range, an $Al_xGa_{1-x}N$ layer having excellent crystal properties can be easily obtained.

The underlying layer 14a may be doped with an n-type impurity within arrange of $1 \times 10^{17}$ to $1 \times 10^{19}/cm^3$ if required. However, the underlying layer 14a may be undoped ($<1 \times 10^{17}/cm^3$). It is preferable that the underlying layer 14a be undoped in terms of maintenance of excellent crystal properties.

For example, if the substrate 11 is conductive, the underlying layer 14a may be doped with a dopant to impart conductivity thereto whereby electrodes can be formed on up- and down-sides of the light-emitting device 1. On the other hand, if an insulative material is used as the substrate 11, the light-emitting device 1 has a chip structure wherein a positive electrode and a negative electrode are provided on the same side of the light-emitting device 1. In this case, the layer present directly on the substrate 11 is preferably formed into undoped crystals because its crystal properties can be improved.

The n-type impurity is not particularly limited. For example, Si, Ge, Sn, etc. can be mentioned. Si and Ge are preferable.

(n-Type Contact Layer)

The n-type contact layer 14b is formed of a group-III nitride semiconductor. It is preferable that the n-type contact layer 14b be formed into an $Al_xGa_{1-x}N$ layer ($0 \leq x \leq 1$, preferably $0 \leq x \leq 0.5$, and more preferably $0 \leq x \leq 0.1$) in the same manner as the underlying layer 14a.

Furthermore, it is preferable that the n-type contact layer 14b be doped with an n-type impurity. It is preferable that the n-type contact layer 14b include an n-type impurity in a concentration of $1 \times 10^{17}$ to $1 \times 10^{19}/cm^3$, and preferably $1 \times 10^{18}$ to $1 \times 10^{19}/cm^3$ in terms of maintenance of a sufficient ohmic contact with a negative electrode, prevention of crack-generation, and maintenance of sufficient crystal properties. The n-type impurity is not particularly limited. For example, Si, Ge, Sn, etc. can be mentioned. Si and Ge are preferable.

Additionally, it is preferable that the gallium nitride-based compound semiconductors that form the underlying layer 14a and the n-type contact layer 14b have the same composition. The total thickness of the underlying layer 14a and the n-type contact layer 14b may be within a range of 0.1 to 20 µm, preferably 0.5 to 15 µm, and more preferably 1 to 12 µm. When the total thickness is within such a range, sufficient crystal properties of the semiconductor can be maintained.

(n-Type Clad Layer)

It is preferable that an n-type clad layer 14c be provided between the n-type contact layer 14b and the light-emitting layer 15. If the n-type clad layer 14c is provided therein, impairment in flatness of the top surface of the n-type contact layer 14b can be recovered. The n-type clad layer 14c can be formed into AlGaN, GaN, GaInN, or the like. Furthermore, the n-type clad layer 14c may be formed into a hetero-junction of such structures or a superlattice structure where a plurality of these is laminated. When the n-type clad layer 14c is formed into GaInN, the band gap thereof is preferably adjusted to larger than that of GaInN of the light-emitting layer 15.

<Light-Emitting Layer>

As shown in FIG. 2, in the light-emitting layer 15, barrier layers 15a made of a gallium nitride-based compound semiconductor, and well layers 15b made of an indium-containing gallium nitride-based compound semiconductor are alternatively laminated, and barrier layers 15a are disposed at both sides adjacent to the n-type semiconductor layer 14 and the p-type semiconductor layer 16. With regard to an example shown in FIG. 2, six barrier layers 15a and five well layers 15b are alternatively laminated in the light-emitting layer 15, barrier layers 15a are disposed as top and bottom layers of the light-emitting layer 15, and each well layer 15b is disposed between the barrier layers 15a.

As an example of the barrier layer 15a, a gallium nitride-based compound semiconductor such as $Al_cGa_{1-c}N$ ($0 \leq c < 0.3$) whose band gap energy is larger than the well layer 15b can be preferably used.

With regard to the well layer 15b, an indium gallium nitride such as $Ga_{1-s}In_sN$ ($0 < s < 0.4$) can be used as an indium-containing gallium nitride-based compound semiconductor.

The total thickness of the light-emitting layer 15 is not particularly limited. However, it is preferable that the light-emitting layer 15 have a thickness such that a quantum effect can be obtained (i.e. preferably having a critical thickness). For example, the thickness of the light-emitting layer 15 is preferably within a range of 1 to 500 nm, and more preferably about 100 nm. If the thickness is within such a range, this contributes to improvement of light-emitting output.

<p-Type Semiconductor Layer>

The p-type semiconductor layer 16 includes a p-type clad layer 16a and a p-type contact layer 16b. Additionally, a p-type contact layer may also function as the p-type clad layer.

(p-Type Clad Layer)

The p-type clad layer 16a is not particularly limited as long as it has a composition that can achieve higher band gap energy than that of the light-emitting layer 15 and that can confine carriers to the light-emitting layer 15. However, for example, $Al_dGa_{1-d}N$ ($0 < d \leq 0.4$, and preferably $0.1 \leq d \leq 0.3$) can be mentioned. It is preferable that the p-type clad layer 16a have such an AlGaN composition in terms of confinement of carriers to the light-emitting layer 15.

The thickness of the p-type clad layer 16a is not particularly limited. However, the thickness is preferably within a range of 1 nm to 400 nm, and more preferably within a range of 5 nm to 100 nm.

The p-type doping concentration of the p-type clad layer 16a is preferably within a range of $1 \times 10^{18}/cm^3$ to $1 \times 10^{21}/cm^3$, and more preferably within a range of $1 \times 10^{19}/cm^3$ to $1 \times 10^{20}/cm^3$. If the p-type doping concentration is within such a range, excellent p-type crystals can be obtained without impairing crystal properties. The p-type impurities are not particularly limited. For example, Mg can be preferably mentioned.

(p-Type Contact Layer)

The p-type contact layer 16b is a gallium nitride-based compound semiconductor that contains at least an $Al_eGa_{1-e}N$ ($0 \leq e < 0.5$, preferably $0 \leq e \leq 0.2$, and more preferably $0 \leq e \leq 0.1$). It is preferable that the ratio of Al is within the above range in terms of maintenance of excellent crystal properties, and a sufficient ohmic contact with a p-ohmic electrode (see a translucent electrode 17 described below).

The thickness of the p-type contact layer 16b is not particularly limited. However, the thickness of the p-type contact layer 16b is preferably within a range of 10 nm to 500 nm, and more preferably with a range of 50 nm to 200 nm. If the thickness is within such a range, its light-emitting output can be maintained at a higher level.

It is preferable that the p-type contact layer 16b contain a p-type dopant at the concentration of $1 \times 10^{18}/cm^3$ to $1 \times 10^{21}/cm^3$, and more preferably $5 \times 10^{19}/cm^3$ to $5 \times 10^{20}/cm^3$ in terms of maintenance of a sufficient ohmic contact, prevention of crack-generation, and maintenance of excellent crystal properties. The p-type impurities are not particularly limited. For example, Mg can be mentioned.

In addition, the semiconductor layer 20 that constitutes the light-emitting device 1 of the present invention is not limited to the above-described embodiment.

As an example of the material for the semiconductor layer of the present invention, beside the above-mentioned material, a gallium nitride-based compound semiconductor represented by general formula $Al_XGa_YIn_ZN_{1-A}M_A$ ($0 \leq X \leq 1$, $0 \leq Y \leq 1$, $0 \leq Z \leq 1$, and $X+Y+Z=1$; symbol "M" represents a group-V element other than nitrogen (N); and $0 \leq A < 1$) is known. Such a known gallium nitride-based compound semiconductor can be used in the present invention without any limitations.

The group-III nitride semiconductor containing Ga as a group-III element can contain another group-III element in addition to Al, Ga and In. Moreover, the group-III nitride semiconductor can contain elements such as Ge, Si, Mg, Ca, Zn, Be, P and As where necessary. Furthermore, the components thereof may not be limited to such intentionally-added elements, but may include impurities that cannot be excluded depending on film-forming conditions, among others; and minor impurities contained in the material of the reaction pipe or raw materials used.

<Translucent Positive Electrode>

The translucent positive electrode 17 is an electrode formed on the p-type semiconductor layer 16 having translucency.

The material for the translucent positive electrode 17 is not particularly limited. For example, ITO ($In_2O_3$—$SnO_2$), AZnO (ZnO—$Al_2O_3$), IZnO ($In_2O_3$—ZnO), GZO (ZnO—$Ga_2O_3$), etc. can be used. Moreover, the translucent positive electrode 17 can have any type of structure including conventional structures without any limitations.

Additionally, the translucent positive electrode 17 may be formed such that the electrode covers the entire surface of the p-type semiconductor layer 16; or may be formed into a grid-like pattern or tree-like pattern having a space between each other.

<Positive Electrode Bonding Pad>

The positive electrode bonding pad 18 is a circular electrode formed on the translucent positive electrode 17, as shown in FIG. 3.

As examples of materials for the positive electrode bonding pad 18, various types of structures using Au, Al, Ni, Cu or the like are known. Such known structures using general materials can be used without any limitations.

The thickness of the positive electrode bonding pad 18 is preferably within a range of 100 nm to 1000 nm. Moreover, the thicker the bonding pad is, the higher bondability can be achieved in terms of properties of the bonding pad. Therefore, it is more preferable that the thickness of the positive bonding pad 18 be 300 nm or more. Furthermore, it is preferable that the thickness be 500 nm or less in terms of production costs.

<Negative Electrode>

The negative electrode 19 is an electrode that comes into contact with the n-type contact layer 14b of the n-type semiconductor layer 14 included in the semiconductor layer 20. Accordingly, a circular form of the negative electrode 19 is provided on an exposed area 14d of the n-type contact layer 14b that is formed by removing a portion of the p-type semiconductor layer 16, the light-emitting layer 15 and the n-type semiconductor layer 14, as shown in FIGS. 2 and 3.

As examples of materials for the negative electrode 19, various types of compositions and structures of the negative electrode are known, and such known negative electrodes can be used in the present invention without any limitations.

[Method of Producing a Light-Emitting Device]

Figure 4:
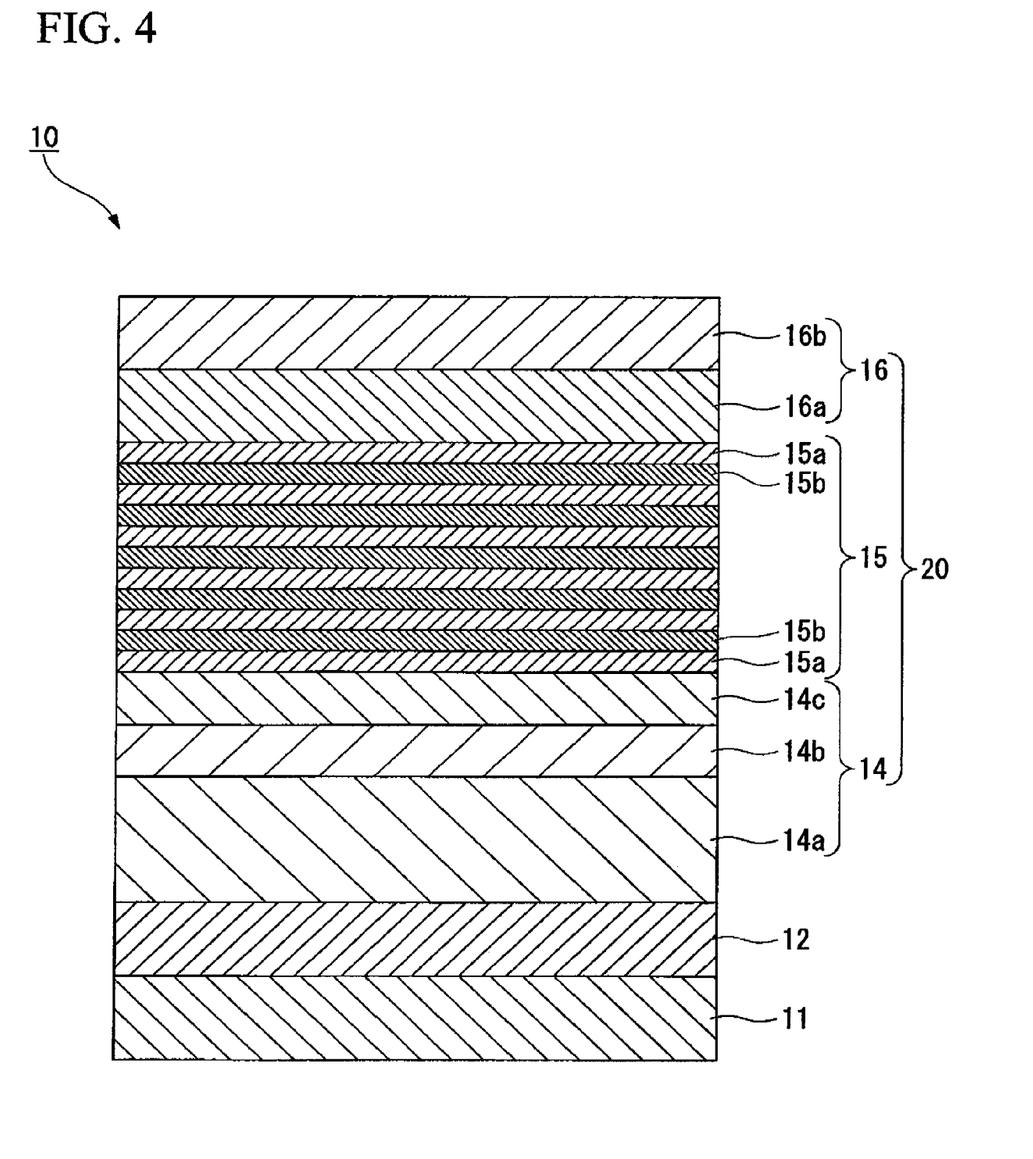
FIG. 4 is a cross-section of a laminate semiconductor explaining a method of producing the group-III nitride semiconductor light-emitting device shown in FIG. 2.

To the light-emitting device 1 shown in FIG. 2, a laminate semiconductor 10 shown in FIG. 4 wherein the semiconductor layer 20 is formed over the substrate 11 is formed at first. To form the laminate semiconductor 10 shown in FIG. 4, the buffer layer 12, the underlying layer 14a and the n-type contact layer 14b are formed on the substrate 11 by the above-described method of producing a group-III nitride semiconductor layer using the sputtering machine 40 shown in FIG. 1.

In the present embodiment, before the buffer layer 12 is formed on the substrate 11, the substrate 11 is subjected to a pretreatment. If the substrate 11 is subjected to pretreatment, the film-forming process can be stably conducted. For example, the pretreatment to the substrate 11 may be conducted in the following way. That is, the substrate 11 may be disposed inside the second plasma-generating region 45b of the sputtering machine 40, and may be sputtered before forming the buffer layer 12. Specifically, the substrate 11 may be exposed into plasma of an $N_2$ gas inside the second plasma-generating region 45b whereby the surface of the substrate 11 can be cleaned. If such plasma of an $N_2$ gas or the like is applied to the surface of the substrate 11, organic substances or oxides adhered to the surface of the substrate 11 can be removed.

In this case, instead of applying power to the target 47, voltage is applied between the substrate 11 and chamber 41. Then, plasma particles of the $N_2$ gas efficiently act on the substrate 11 whereby the substrate 11 is cleaned.

Additionally, the pretreatment to the substrate 11 is not limited to the above-mentioned method. For example, if a silicon substrate is used as the substrate 11, a wetting cleaning method such as the well-known RCA cleaning method can also be used where the surface is made into a state of hydrogen termination.

After the substrate 11 is subjected to the pretreatment, the buffer layer 12, the underlying layer 14a of an undoped semiconductor layer and the n-type contact layer 14b are formed on the substrate 11 in that order by the above-described method of producing a group-III nitride semiconductor layer using the sputtering machine 40 shown in FIG. 1.

After that, the n-type clad layer 14c of the n-type semiconductor layer 14; the light-emitting layer 15 including the barrier layers 15a and the well layers 15b; and the p-type clad layer 16a and the p-type contact layer 16b of the p-type semiconductor layer 16 are formed by the MOCVD (Metal-Organic Chemical Vapour Deposition) method, which is preferable in terms of its controllability of film-thickness.

In the MOCVD method, for example, hydrogen ($H_2$) or nitrogen ($N_2$) as a carrier gas; trimethyl gallium (TMG) or triethyl gallium (TEG) as a Ga source of a group-III material; trimethyl aluminum (TMA) or triethyl aluminum (TEA) as an Al source; trimethyl indium (TMI) or triethyl indium (TEI) as an In source; and ammonia ($NH_3$) or hydrazine ($N_2H_4$) as an N source of a V-group material can be used.

As n-type impurities of dopant elements, monosilane ($SiH_4$) or disilane ($Si_2H_6$) as a Si material; and germane gas ($GeH_4$), or an organic germanium compound such as tetramethyl germanium (($CH_3$)$_4$Ge) or tetraethyl germanium (($C_2H_5$)$_4$Ge) as a Ge source can be used.

With regard to n-type impurities of dopant elements, for example, bis(cyclopentadienyl)magnesium ($Cp_2Mg$) or bis (ethylcyclopentadienyl)magnesium ($EtCp_2Mg$) can be used as a Mg material.

On the p-type contact layer 16b of the laminate semiconductor 10 shown in FIG. 4 obtained in this way, the translucent positive electrode 17 and the positive electrode bonding pad 18 are formed in that order by a photolithographic method.

Then, the laminate semiconductor 10 wherein the translucent positive electrode 17 and the positive bonding pad 18 are formed is dry-etched whereby the exposed area 14d of the n-type contact layer 14b is formed.

After that, the negative electrode 19 is formed on the exposed area 14d by using a photolithographic method whereby the light-emitting device 1 shown in FIGS. 2 and 3 is produced.

With regard to the light-emitting device of the present embodiment, the underlying layer 14a and the n-type contact layer 14b of the n-type semiconductor layer 14 in the semiconductor layer 20 are formed by the above-described method of producing a group-III nitride semiconductor layer using the sputtering machine 40 shown in FIG. 1. Accordingly, the light-emitting device is a group-III nitride semiconductor light-emitting device that includes the semiconductor layer 20 having excellent crystal properties.

Furthermore, in the light-emitting device of the present embodiment, the buffer layer 12 formed of a group-III nitride semiconductor is formed between the substrate 11 and the n-type semiconductor layer 14 by the above-described method of producing a group-III nitride semiconductor layer using the sputtering machine 40 shown in FIG. 1. Accordingly, the light-emitting device has the buffer layer 12 having excellent crystal properties. When the buffer layer 12 having excellent crystal properties is formed under the n-type semiconductor layer 14 in this way, the n-type semiconductor layer 14 having excellent crystal properties can be easily formed on the buffer layer 12. Thus, the light-emitting device of the present embodiment includes the semiconductor layer 20 having very excellent crystal properties.

In addition, in the present embodiment, the underlying layer 14a and the n-type contact layer 14b of the n-type semiconductor layer 14 in the semiconductor layer 20 of the light-emitting device 1 are described with respect to the method wherein these layers are formed by the above method of producing a group-III nitride semiconductor layer using the sputtering machine 40 shown in FIG. 1 as an example thereof. However, the present invention is not limited to the above-described example, and at least one portion of the semiconductor layer 20 may be formed by the method of producing a group-III nitride semiconductor layer of the present invention.

For example, the n-type clad layer 14c of the n-type semiconductor layer 14 or the p-type semiconductor layer 16 can also be formed by the method of producing a group-III nitride semiconductor layer of the present invention while these layers are formed by the MOCVD method in the present embodiment.

As mentioned above, at least one portion of the semiconductor layer 20 of the light-emitting device 1 of the present invention may be formed by the method of producing a group-III nitride semiconductor layer of the present invention. To form the semiconductor layer 20, the method of producing a group-III nitride semiconductor layer of the present invention can be combined with any methods that enable production of the group-III nitride semiconductor layer, including conventional sputtering methods, the MOCVD (Metal-Organic Chemical Vapor Deposition) method, the HVPE (Hydride Vapor Phase Epitaxy) method, the MBE (Molecular-beam epitaxy) method, etc.

The group-III nitride semiconductor of the present invention can be applied, for example, to a photoelectric conversion device such as a laser device or a light receiving device, or an electric device such as a HBT or HEMT. Many types of such semiconductor devices having various structures are known. The structure of the group-III nitride semiconductor light-emitting device of the present invention is not particularly limited, and can include such known device structures.

[Lamp]

The lamp of the present invention includes the light-emitting device of the present invention.

As an example of the lamp of the present invention, a lamp wherein the light-emitting device of the present invention is combined with a phosphor can be mentioned. Such a lamp including the light-emitting device and the phosphor can be formed into structures generally known in the art using known methods. Additionally, techniques of modifying color of the emitted light according to combination of a light-emitting device with a phosphor are conventionally known. Such techniques can be applied to the lamp of the present invention without any limitations.

For example, by selecting an appropriate phosphor used in the lamp, light having a longer wavelength than that of the light-emitting device can be achieved. In addition, the wavelength of the light emitted from the light-emitting device may be mixed with a wavelength converted by the phosphor to provide a lamp emitting white light.

Figure 5:
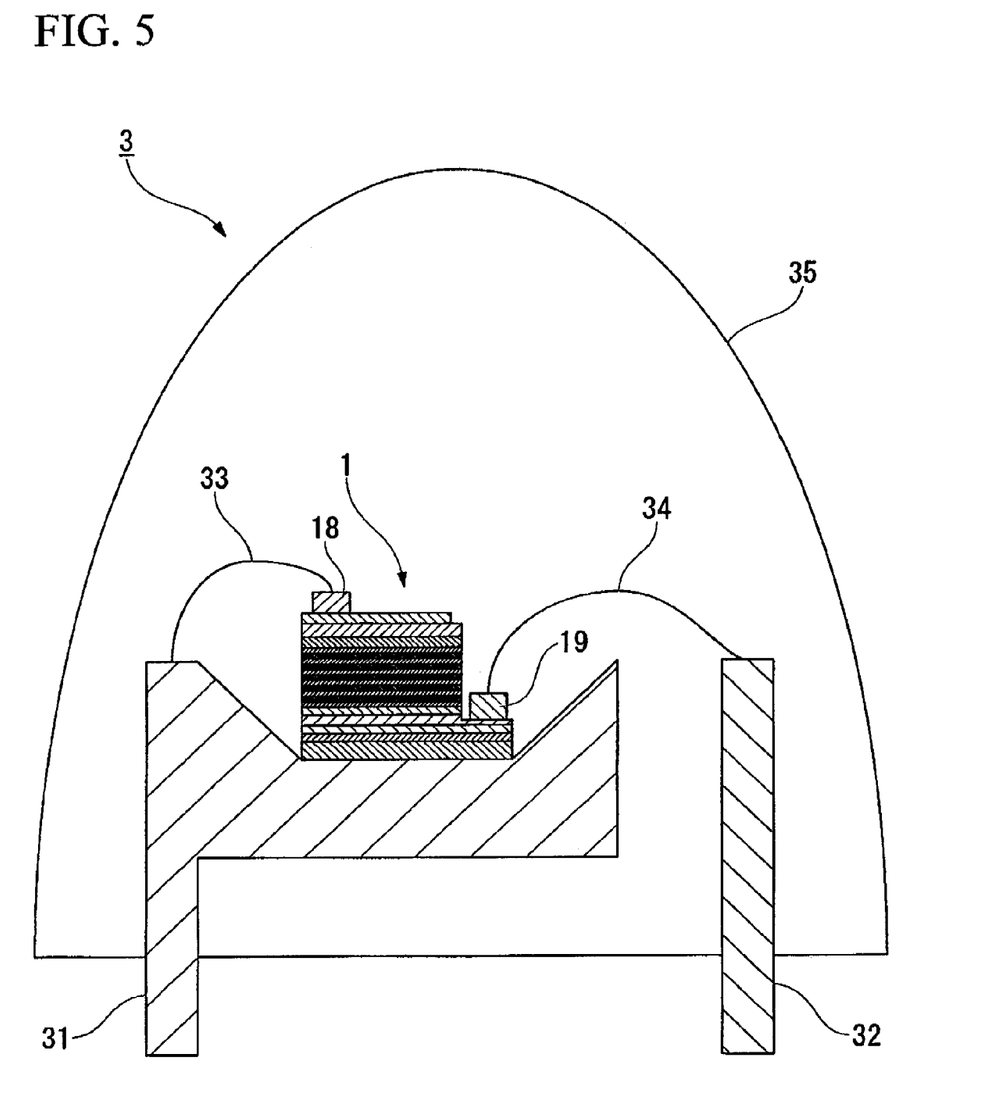
FIG. 5 is a schematic diagram showing an example of the lamp including the group-III nitride semiconductor light-emitting device of the present invention.

FIG. 5 is a schematic diagram showing an example of the lamp including the group-III nitride semiconductor light-emitting device of the present invention. The lamp 3 shown in FIG. 5 is a shell-shaped lamp, and the light-emitting device 1 shown in FIG. 5 is used therein. As shown in FIG. 5, the positive electrode bonding pad (see symbol "18" shown in FIG. 3) of the light-emitting device 1 is connected to a frame 31 or 32 (frame 31 in FIG. 5) with a wire 33, and the negative electrode (see symbol "19" shown in FIG. 3) of the light-emitting device 1 is connected to the other frame (frame 32 in FIG. 5) with a wire 34, thereby forming the light-emitting device 1. In addition, the light-emitting device 1 is encapsulated with a mold 35 made of a transparent resin.

Because the light-emitting device of the present invention is included in the lamp of the present invention, the lamp exhibits excellent light-emitting properties.

Additionally, the lamp of the present invention can be arranged in various forms such as a generally-used shell-shaped type, side-view type used as a backlight in cellular phones, or a top-view type used in indicators.

EXAMPLES

Hereinafter, the present invention will be described in detail with reference to Examples and Comparative Examples. However, the present invention is not limited to Examples.

Example 1

The light-emitting device 1 shown in FIGS. 2 and 3 was produced by a production method using the sputtering machine 40 shown in FIG. 1. The procedures thereof are explained below.

At first, an AlN layer was formed as the buffer layer 12 on the c-plane of the sapphire substrate 11 using the sputtering machine 40 shown in FIG. 1. Then, the underlying layer 14a of an undoped GaN layer and the n-type contact layer 14b of a Si-doped GaN layer included in the n-type semiconductor layer 14 were formed thereon in that order.

More specifically, a two-inch substrate 11 made of sapphire, one side of which is mirror-ground such that epitaxial growth can be conducted thereon, was prepared. The substrate 11 was disposed inside the second plasma-generating region 45b in the sputtering machine 40 shown in FIG. 1 without conducting a pretreatment such as a wet treatment. The sputtering machine 40 includes a radio frequency (RF) power supply, and a system that can move the magnet position inside the target 47 made of Al. In addition, the magnet inside the target 47 was rotated while washing the substrate 11, and while film-forming (as described below).

Then, the substrate 11 was heated to 500° C. Only nitrogen gas was injected into the second plasma-generating region 45b at a flow rate of 30 sccm, and the pressure inside the second plasma-generating region 45b was maintained at 1.0 Pa, a high-frequency bias of 50 W was applied to the substrate 11, and the substrate 11 was exposed to nitrogen plasma to clean the surface of the substrate 11.

Then, while the injection of the nitrogen gas into the second plasma-generating region 45b was continued, argon gas was injected into the first plasma-generating region 45a, and the temperature of the substrate 11 was maintained at 500° C.

After that, the pressure inside the first plasma-generating region 45a was adjusted to 0.5 Pa, and the flow rate of the argon gas was maintained at 5 sccm. An RF power of 5 W/cm$^2$ was applied to the target 47 made of Al to generate the first plasma containing argon (first plasma-generating step). At the same time, the pressure inside the second plasma-generating region 45b was adjusted to 0.5 Pa, the flow rate of the nitrogen was maintained at 15 sccm (the ratio of the nitrogen to the entire gas inside the chamber 41 was 75%), and an RF power of 0.5 W/cm$^2$ was applied to the substrate 11 to supply the second plasma containing nitrogen onto the substrate 11 (second plasma-generating step).

The first plasma-generating step and the second plasma-generating step were conducted at a pre-measured film-forming rate (0.12 nm/s) for a predetermined time to form a buffer layer 12 of AlN having a thickness of 50 nm on the c-plane of the substrate 11. After film-forming, plasma-generating inside the chamber 41 was terminated, and the substrate 11 was cooled to room temperature.

Then, the substrate 11, where the buffer layer 12 was formed, was taken out from the second plasma-generating region 45b of the sputtering machine 40, and the substrate 11 was delivered into a second plasma generating region 45b of the other sputtering machine 40 having the same structure as the above sputtering machine. The sputtering machine 40, which was used for forming an underlying layer 14a of an n-type semiconductor layer 14, included a target 47 made of a metal Ga, and a pipe from which a coolant was circulated to the target 47. While forming the underlying layer 14a, the coolant that was cooled to 20° C. was circulated to the pipe to prevent the Ga from melting due to the heat.

In addition, before forming an underlying layer 14a, the surface of the substrate 11 where the buffer layer 12 was formed was cleaned in the same manner as the above-described cleaning of the substrate 11 conducted before forming the buffer layer 12.

Subsequently, the substrate 11 was heated to 1000° C., and the temperature was stably maintained. Then, while the injection of the nitrogen gas into the second plasma-generating region 45b was continued, injection of argon gas into the first plasma-generating region 45a was started.

After that, the pressure inside the first plasma-generating region 45a was adjusted to 0.5 Pa, and the flow rate of the argon gas was maintained at 5 sccm. An RF power of 5 W/cm$^2$ was applied to the target 47 made of Ga to generate the first plasma containing argon (first plasma-generating step). At the same time, the pressure inside the second plasma-generating region 45b was adjusted to 0.5 Pa, the flow rate of the nitrogen was maintained at 15 sccm (the ratio of the nitrogen to the entire gas inside the chamber 41 was 75%), and an RF power of 0.5 W/cm$^2$ was applied to the substrate 11 to supply the second plasma containing nitrogen onto the substrate 11 (second plasma-generating step).

In this way, the underlying layer 14a of Ga having a thickness of 6 μm was formed on the buffer layer 12 formed on the substrate 11. The film-forming rate for the underlying layer 14a was 1 nm/s. After film-forming, the plasma generation inside the chamber 41 was terminated, and the substrate 11 was cooled to room temperature.

The X-ray rocking curve (XRC) of the undoped GaN layer (underlying layer 14a) formed in the above-described manner was measured using an X-ray measurement device (a four-crystal X-ray measurement device "X'pert" produced by PANalytical). In this measurement, a Cu β-ray X-ray generator was used as a light source, and the measurement was conducted with respect to the (0002) plane, i.e. a symmetric plane, and the (10-10) plane, i.e. asymmetric plane. In general, the half-value width of the XRC spectrum of the (0002) plane can be an index for flatness (mosaicity) of crystals, and the half-value width of the XRC spectrum of the (10-10) plane can be an index for dislocation density (twist) in group-III nitride compound semiconductors.

Based on the results of the X-ray rocking curve (XRC) measurement, the underlying layer 14a formed by the production method in Example 1 indicated a half-value width of 40 arcsec in the (0002) plane measurement and a half-value width of 350 arcsec in the (10-10) plane measurement.

Then, the substrate 11 including layers up to the underlying layer 14a was taken out from the second plasma-generating region 45b of the sputtering machine 40, and the substrate 11 was further delivered into a second plasma-generating region 45b of another sputtering machine 40 having the same structure. The sputtering machine 40 arranged for forming an n-type contact layer 14b was arranged in the same manner as the sputtering machine 40 used for forming the underlying layer 14a except that a Si piece was disposed on a Ga target (i.e. as a target 47).

Furthermore, the formation of the n-type contact layer 14b was conducted under the same conditions as the above-described formation of the underlying layer 14a, and the n-type contact layer 14b of a 2 μm Si-doped GaN layer having an electron concentration of $1\times10^{19}$ cm$^{-3}$ was formed on the underlying layer 14a of the substrate 11. After film-forming, the plasma generation inside the chamber 41 was terminated, and the substrate 11 was cooled to room temperature. The film-forming rate for the n-type contact layer 14b was 1 nm/s.

The above-obtained substrate 11 of Example 1 where layers up to the n-type contact layer 14b were formed had a colorless and transparent mirror-like surface.

Subsequently, the substrate 11 that included layers up to the n-type contact layer 14b was loaded into a MOCVD furnace, and each layer included in the semiconductor layer 20 was formed over the n-type contact layer 14b to produce the laminate semiconductor 10 shown in FIG. 4.

The obtained laminate semiconductor 10 had a layer structure wherein the 50 nm buffer layer 12 of AlN having a columnar structure; the 6 μm underlying layer 14a of undoped GaN; the 2 μm n-type contact layer 14b of Si-doped GaN having an electron concentration of $1\times10^{19}$ cm$^{-3}$; the 20 nm n-type clad layer 14c of a $In_{0.1}Ga_{0.9}N$-type clad layer having an electron concentration of $1\times10^{18}$ cm$^{-3}$; a light-emitting layer 15 having a multiple quantum well structure (laminate structure) wherein six barrier layers 15a of GaN 16 nm thick and five well layers 15b of undoped $In_{0.2}Ga_{0.8}N$ 3 nm thick were alternatively laminated, and the GaN barrier layers were present at both sides; and a p-type semiconductor layer 16 that included a 5 nm p-type clad layer 16a of Mg-doped $Al_{0.1}Ga_{0.9}N$, and a p-type contact layer 16b of Mg-doped $Al_{0.02}Ga_{0.98}N$ 200 nm thick were provided on the sapphire substrate having a c-plane in that order.

The p-type contact layer 16b of Mg-doped $Al_{0.02}Ga_{0.98}N$ included in the obtained laminate semiconductor 10 exhibited p-type properties even though an annealing treatment was not conducted to activate p-type carriers.

Then, a light-emitting device 1 shown in FIGS. 2 and 3 was produced using the laminate semiconductor 10.

At first, using a known photolithographic method, a translucent positive electrode 17 of ITO was formed on the surface of the p-type contact layer 16b in the laminate semiconductor 10, and a positive electrode bonding pad 18 that had a structure where Ti, Al, and Au were laminated in that order on the surface of the translucent positive electrode 17 was formed thereon.

Then, the laminate semiconductor 10 wherein the translucent positive electrode 17 and the positive electrode bonding pad 18 were formed was dry-etched to form an exposed area 14d of the n-type contact layer 14b. A negative electrode 19 including four layers of Ni, Al, Ti and Au was formed on the exposed area 14d using a photolithographic method whereby the light-emitting device 1 shown in FIGS. 2 and 3 was produced.

The backside of the substrate 11 of the above-obtained light-emitting device 1 was ground and lapped whereby its surface was mirror-finished. This was cut into a chip of 350 µm². Then, the chip was mounted on a lead frame with the electrode-present-side up, and the chip was wired to the lead frame with a gold wire to produce a light-emitting diode.

A forward current was applied between the positive bonding pad 18 and the negative electrode 19 of the light-emitting diode. The forward voltage was 3.1 V when the current was 20 mA. Furthermore, its light-emitting state was analyzed through the p-side translucent positive electrode 17. Consequently, it was revealed that the wavelength of the emitted light was 470 nm, and the light-emitting output was 14.5 mW. Light-emitting diodes produced from any part of the produced wafer uniformly exhibited such light-emitting properties as a light-emitting diode.

Comparative Example 1

The light-emitting device 1 shown in FIGS. 2 and 3 was produced by a production method using a conventional sputtering machine that did not include a shielding wall 45 present in the sputtering machine 40 shown in FIG. 1. The procedures are described below.

First, a mixed gas of argon and nitrogen was injected into a chamber of the conventional sputtering machine, and RF power was applied only to a target whereby an aggregate of columnar crystals of AlN was formed as a buffer layer 12 on a c-plane of a sapphire substrate 11. Then, an underlying layer 14a of an undoped GaN layer in the n-type semiconductor layer 14, and an n-type contact layer 14b of a Si-doped GaN layer in the n-type semiconductor layer 14 were formed thereon in that order.

Then, the X-ray rocking curve (XRC) of the above-formed undoped GaN layer (underling layer 14a) was measured in the same way as Example 1.

Based on the results of the X-ray rocking curve (XRC) measurement, the undoped GaN layer formed by the production method in Comparative Example 1 indicated a half-value width of 100 arcsec in the (0002) plane measurement and a half-value width of 600 arcsec in the (10-10) plane measurement.

In addition, it was confirmed by visual observation that the substrate 11 including layers up to the n-type contact layer 14b had a mirror-like surface.

Next, the substrate 11 including layers up to the n-type contact layer 14b was delivered into an MOCVD furnace, and each layer included in the semiconductor layer 20 was formed in the same manner as Example 1 to produce a laminate semiconductor 10 shown in FIG. 4.

Then, a light-emitting device 1 shown in FIGS. 2 and 3 was produced in the same manner as Example 1 by using the above-obtained laminate semiconductor 10, and a light-emitting diode was produced in the same manner as Example 1 using the light-emitting device 1.

A forward current was applied between the positive bonding pad 18 and the negative electrode 19 of the light-emitting diode. The forward voltage was 3.2 V when the current was 20 mA. Furthermore, its light-emitting state was analyzed through the p-side translucent positive electrode 17. Consequently, it was revealed that the wavelength of the emitted light was 470 nm, and the light-emitting output was 14.0 mW. Light-emitting diodes produced from any part of the produced wafer uniformly exhibited such light-emitting properties as a light-emitting diode.

However, film-forming rates were gradually slowed in continuous film-forming by sputtering in any one of processes of forming the buffer layer 12, the underlying layer 14a, and the n-type contact layer 14b in Comparative Example 1. Furthermore, the chamber of the sputtering machine was opened to the atmosphere, and the target was visually observed. Consequently, it was confirmed that both the surface of the Al target used for forming the buffer layer and the surfaces of the Ga targets used for forming the underlying layer and the contact layer became opaque. Based on further analysis, it was revealed that this resulted from generation of a nitride film.

The invention claimed is:

1. An apparatus for producing a group-III nitride semiconductor layer which forms a group-III nitride semiconductor layer on a substrate by a sputtering method, the apparatus comprising:
    a first plasma-generating region where a target containing a group-III element is disposed and the target is sputtered to generate material particles formed of a material contained in the target; and
    a second plasma-generating region where the substrate is disposed and nitrogen-containing plasma is generated,
    wherein the first plasma-generating region and the second plasma-generating region are provided inside a chamber, and the first plasma-generating region and the second plasma-generating region are separated by a shielding wall which has an opening part from which the material particles are supplied onto the substrate.

2. The apparatus for producing a group-III nitride semiconductor layer according to claim 1, wherein the target and the substrate are disposed facing one another through the opening part.

3. The apparatus for producing a group-III nitride semiconductor layer according to claim 1, wherein the target contains at least one selected from the group consisting of Al, Ga and In.

4. A method of producing a group-III nitride semiconductor layer which forms a group-III nitride semiconductor layer on a substrate by a sputtering method using the apparatus for producing a group-III nitride semiconductor layer according to claim 1, the method comprising:
    a first plasma-generating step where material particles are produced in the first plasma-generating region; and
    a second plasma-generating step where the nitrogen-containing plasma is supplied onto the substrate in the second plasma generating region,
    wherein the first plasma-generating step and the second plasma-generating step are performed at the same time, and the material particles are supplied onto the substrate through the opening part.

5. The method of producing a group-III nitride semiconductor layer according to claim 4, wherein the material particles are supplied from the target, which is disposed facing the substrate through the opening part, onto the substrate.

6. The method of producing a group-III nitride semiconductor layer according to claim 4, wherein the target contains at least one selected from the group consisting of Al, Ga and In.

7. A method of producing a group-III nitride semiconductor light-emitting device wherein the group-III nitride semiconductor light-emitting device includes a semiconductor layer in which an n-type semiconductor layer, a light-emitting layer and a p-type semiconductor layer that are formed of a group-III nitride semiconductor are laminated over a substrate, the method comprising: forming at least one portion of the semiconductor layer by the method of producing a group-III nitride semiconductor layer according to claim 4.

8. A method of producing a group-III nitride semiconductor light-emitting device wherein the group-III nitride semiconductor light-emitting device includes a semiconductor layer in which an n-type semiconductor layer, a light-emitting layer and a p-type semiconductor layer that are formed of a group-III nitride semiconductor are laminated over a substrate; and a buffer layer formed of a group-III nitride semiconductor between the substrate and the n-type semiconductor layer, the method comprising: forming the buffer layer by the method of producing a group-III nitride semiconductor layer according to claim 4.

9. A group-III nitride semiconductor light-emitting device which is obtained by the method of producing a group-III nitride semiconductor light-emitting device according to claim 7.

10. A lamp including the group-III nitride semiconductor light-emitting device according to claim 9.

11. A group-III nitride semiconductor light-emitting device which is obtained by the method of producing a group-III nitride semiconductor light-emitting device according to claim 8.

* * * * *